(12) United States Patent
Lee et al.

(10) Patent No.: US 11,538,821 B2
(45) Date of Patent: Dec. 27, 2022

(54) SEMICONDUCTOR DEVICES

(71) Applicant: SK hynix Inc., Icheon-si (KR)

(72) Inventors: Go Hyun Lee, Icheon-si (KR); Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 160 days.

(21) Appl. No.: 16/999,299

(22) Filed: Aug. 21, 2020

(65) Prior Publication Data
US 2021/0242232 A1 Aug. 5, 2021

(30) Foreign Application Priority Data

Feb. 4, 2020 (KR) ........................ 10-2020-0013092

(51) Int. Cl.
| | |
|---|---|
| *H01L 27/11575* | (2017.01) |
| *H01L 27/11519* | (2017.01) |
| *H01L 27/11524* | (2017.01) |
| *H01L 27/11556* | (2017.01) |
| *H01L 23/522* | (2006.01) |
| *H01L 27/11565* | (2017.01) |
| *H01L 27/1157* | (2017.01) |
| *H01L 27/11582* | (2017.01) |
| *H01L 27/11548* | (2017.01) |

(52) U.S. Cl.
CPC .... *H01L 27/11575* (2013.01); *H01L 23/5226* (2013.01); *H01L 27/1157* (2013.01); *H01L 27/11519* (2013.01); *H01L 27/11524* (2013.01); *H01L 27/11548* (2013.01); *H01L 27/11556* (2013.01); *H01L 27/11565* (2013.01); *H01L 27/11582* (2013.01)

(58) Field of Classification Search
CPC .................................................. H01L 27/11575
See application file for complete search history.

(56) References Cited

U.S. PATENT DOCUMENTS

| | | | |
|---|---|---|---|
| 8,456,909 B2 | 6/2013 | Lee et al. | |
| 9,564,451 B1 | 2/2017 | Shin et al. | |
| 2015/0187789 A1* | 7/2015 | Lee | ................... H01L 29/66825 |
| | | | 257/326 |

* cited by examiner

*Primary Examiner* — Yu-Hsi D Sun

(57) ABSTRACT

A semiconductor device is disclosed. The semiconductor device includes a first slit, at least one word line, and a second slit. The first slit is disposed at a boundary between contiguous memory blocks to isolate the memory blocks from each other, and includes a first outer slit and a second outer slit, the second outer slit is spaced apart in a first direction from the first outer slit by a predetermined distance. The word line is disposed, between the first and second outer slits, including a center region having a first end and a second end, and an edge region located at the first end and a second end of the center region, and the second slit is disposed at the center region that isolate area of the word line in the center region on either side of the second slit, wherein the word line is continuous in the edge regions.

16 Claims, 23 Drawing Sheets

US 11,538,821 B2

SEMICONDUCTOR DEVICES

CROSS-REFERENCE TO RELATED APPLICATION

This patent application claims priority to Korean patent application No. 10-2020-0013092, filed on Feb. 4, 2020, which is hereby incorporated in its entirety by reference.

TECHNICAL FIELD

The technology and implementations disclosed herein generally relate to a semiconductor device, and more particularly to a three-dimensional (3D) semiconductor memory device.

BACKGROUND

A semiconductor device may include a memory cell array provided with a plurality of memory cells. The memory cell array may include a plurality of memory cells arranged in structures with different shapes or dimensions. For example, in order to increase the degree of integration of semiconductor devices, memory cells may be three-dimensionally (3D) arranged over a semiconductor substrate. In a fabrication process of a three-dimensional (3D) semiconductor device, a stacked structure may be formed by stacking a plurality of material films.

SUMMARY

Various embodiments of the disclosed technology relate to a semiconductor device with reduced word-line resistance in which edge portions of the word lines are merged.

In an aspect of the disclosed technology, a semiconductor device may include a first slit disposed at a boundary between contiguous memory blocks to isolate the memory blocks from each other, and including a first outer slit and a second outer slit, the second outer slit spaced apart in a first direction from the first outer slit by a predetermined distance, at least one word line disposed, between the first and second outer slits, including a center region having a first end and a second end, and an edge region located at the first end and the second end, of the center region, and a second slit disposed at the center region that isolates area of the word line in the center region on either side of the second slit, wherein the word line is continuous in the edge regions.

In another aspect of the disclosed technology, a semiconductor device may include a plurality of first slits disposed at a boundary region of contiguous memory blocks isolating the memory blocks from each other, and disposed to be spaced apart from each other by a predetermined distance in a first direction, at least one word line disposed between the first slits disposed in a square shape, at least one drain selection line disposed over the word line, and a plurality of isolation patterns disposed to isolate each segment of the at least one drain selection line into units of a block, wherein the at least one word line is integrated into a single structure.

In a further aspect of the disclosed technology, a semiconductor device may include a source selection line disposed over a substrate, a plurality of word lines vertically stacked over the source selection line, a drain selection line stacked over the plurality of word lines, a slit defined in a center region of the plurality of word lines that vertically penetrates the source selection line, the plurality of word lines, and the drain selection line, and that isolates the source selection line, the plurality of word lines, and the drain selection line from one another in the center region, and a plurality of isolation patterns spaced apart from each other by a predetermined distance in edge regions of the plurality of word lines, and dividing the drain selection line into a plurality of isolated segments.

It is to be understood that both the foregoing general description, and the following detailed description, of the technology disclosed herein are illustrative and explanatory and intended to provide further explanation of the scope of the disclosure to those skilled in the art.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of a semiconductor device that substantially addresses one or more issues related to limitations or disadvantages of the related art.

Some implementations of the disclosed technology suggest a semiconductor device that can reduce word-line resistance by merging edge portions of word lines. The disclosed technology provides various implementations of a semiconductor device that can improve performance or throughput thereof by reducing resistance of word lines.

Reference will now be made in detail to aspects of the disclosed technology, embodiments and examples of which are illustrated in the accompanying drawings. Wherever possible, the same reference numbers are used throughout the drawings to refer to the same or like portions.

In association with the embodiments of the disclosed technology, specific structural and functional descriptions are disclosed only for illustrative purposes. The embodiments represent a limited number of possible embodiments; however, embodiments of the disclosed technology can be implemented in various or different ways without departing from the scope or spirit of the disclosed technology.

In describing the disclosed technology, the terms "first" and "second" may be used to describe multiple components, but the components are not limited by the terms in number or order. The terms may be used to distinguish one component from another component. For example, a first component may be called a second component and a second component may be called a first component without departing from the scope of the disclosure.

The terms used in the present application are merely used to describe specific embodiments and are not intended to limit the disclosed technology. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning as the context of the relevant art and should not be analyzed to have an ideal meaning or an excessively formal meaning unless clearly defined in the present application. The terminology used in the disclosed technology is for the purpose of describing particular embodiments only and is not intended to limit the disclosure.

Figure 1A:
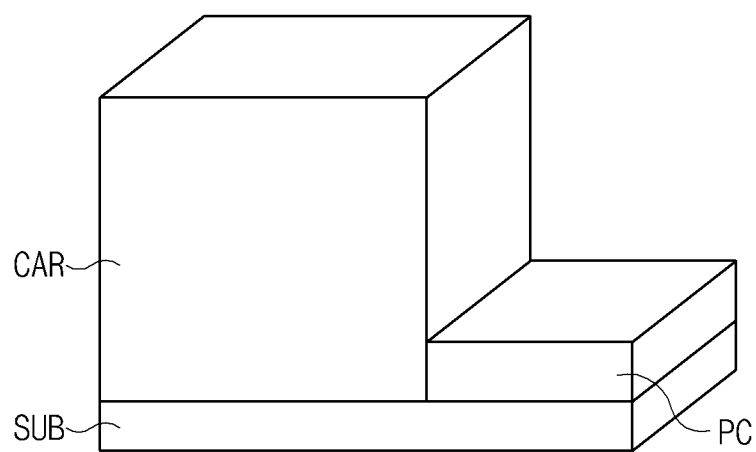
FIGS. 1A and 1B are diagrams illustrating semiconductor devices in accordance with an embodiment of the disclosure.
Figure 1B:
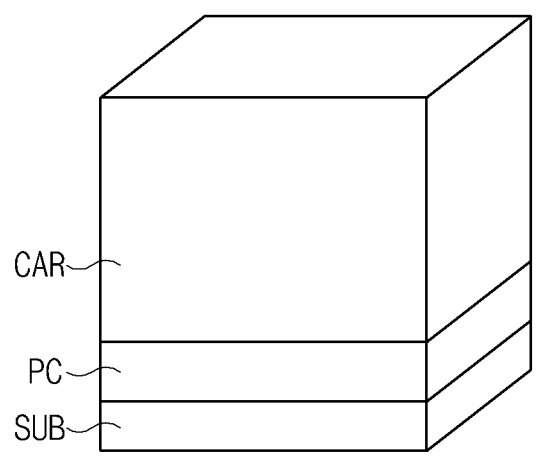

FIGS. 1A and 1B are diagrams illustrating semiconductor devices in accordance with an embodiment of the disclosure.

Referring to FIGS. 1A and 1B, each of the semiconductor devices may include a peripheral circuit structure (PC) and a cell array (CAR) that are disposed over a substrate (SUB).

The substrate (SUB) may be a monocrystalline semiconductor film. For example, the substrate (SUB) may be any one of a bulk-silicon substrate, a silicon-on-insulator (SOI) substrate, a germanium (Ge) substrate, a germanium-on-insulator (GOI) substrate, and a silicon-germanium substrate, or an epitaxial thin film that is formed by a selective epitaxial growth (SEG) process.

The cell array (CAR) may include a plurality of memory blocks. Each memory block may include a plurality of cell strings. Each cell string may be electrically coupled to a bit line, a source line, word lines, and selection lines. Each cell string may include memory cells coupled in series to each other and selection transistors coupled in series to each other. Each of the selection lines may be used as a gate electrode of a corresponding selection transistor, and each of the word lines may be used as a gate electrode of a corresponding memory cell.

The peripheral circuit structure (PC) may include NMOS and PMOS transistors, a resistor, and a capacitor that are electrically coupled to the cell array (CAR). The NMOS and PMOS transistors, the resistor, and the capacitor may be used as constituent elements of a row decoder, a column decoder, a page buffer, and a control circuit.

Referring to FIG. 1A, the peripheral circuit structure (PC) may be disposed over a region of the substrate (SUB) that does not overlap with cell array (CAR).

Alternatively, as shown in FIG. 1B, the peripheral circuit structure (PC) may be disposed between the cell array (CAR) and the substrate (SUB). In this example, the peripheral circuit structure (PC) is formed to overlap with the cell array (CAR), and therefore the substrate (SUB) region occupied by both the cell array (CAR) and the peripheral circuit structure (PC) can be reduced in size. In other embodiments of the disclosed technology, the cell array (CAR) may be disposed between the substrate (SUB) and the peripheral circuit structure (PC).

Figure 2:
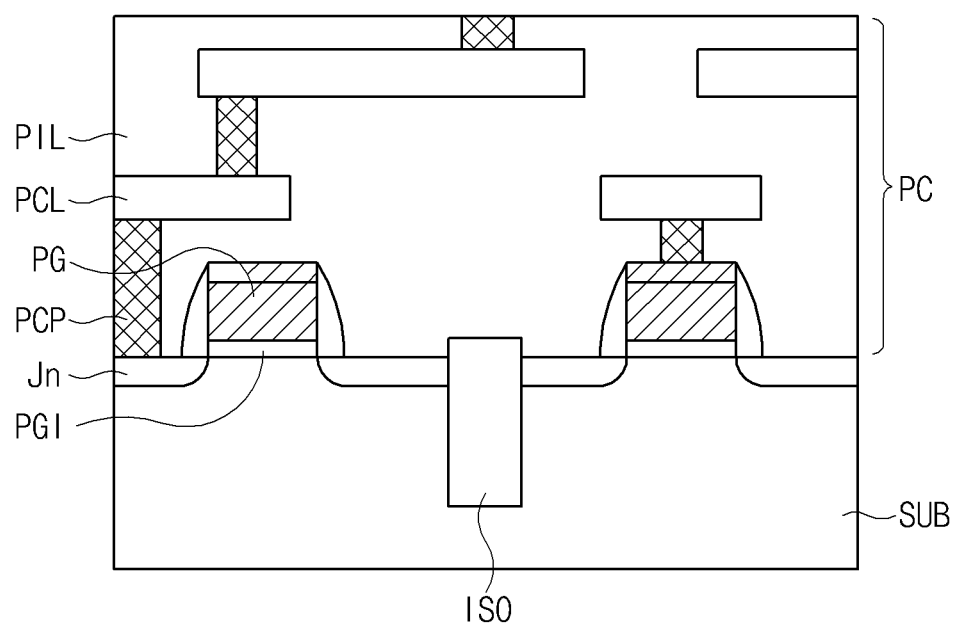
FIG. 2 is a cross-sectional view illustrating peripheral circuit structures shown in FIGS. 1A and 1B.

FIG. 2 is a cross-sectional view illustrating peripheral circuit structures (PC) shown in FIGS. 1A and 1B. The peripheral circuit structure (PC) shown in FIG. 2 may be contained or disposed in the peripheral circuit structure (PC) shown in FIG. 1A, or may be contained or disposed in the peripheral circuit structure (PC) shown in FIG. 1B.

Referring to FIG. 2, the peripheral circuit structure (PC) may include peripheral gate electrodes (PG), a peripheral gate insulation film (PGI), junctions (in), peripheral circuit lines (PCL), peripheral contact plugs (PCP), and a peripheral circuit insulation film (PIL).

The peripheral gate electrodes (PG) may be used as gate electrodes of an NMOS or a PMOS transistor of the peripheral circuit structure (PC). A peripheral gate insulation film PGI may be disposed between the substrate (SUB) and each of the peripheral gate electrodes (PG).

The junctions (in) may be defined by implanting N-type or P-type impurities into the active region of the substrate (SUB). For example, the junctions (in) may be disposed at both or opposite sides of each peripheral gate electrode (PG), such that the junctions (in) may be used as a source junction and a drain junction. Active regions of the substrate (SUB) may be partitioned by a device isolation layer (ISO) formed in the substrate (SUB). The device isolation layer (also called a device isolation film) may be formed of an insulation material.

The peripheral circuit lines (PCL) may be electrically coupled to a circuit of the peripheral circuit structure (PC) through peripheral contact plugs (PCP).

The peripheral circuit insulation film (PIL) may be formed to cover a circuit of the peripheral circuit structure (PC), the peripheral circuit lines (PCL), and the peripheral contact plugs (PCP). The peripheral circuit insulation film (PIL) may include or be formed from insulation films stacked in a multilayer structure.

Figure 3:
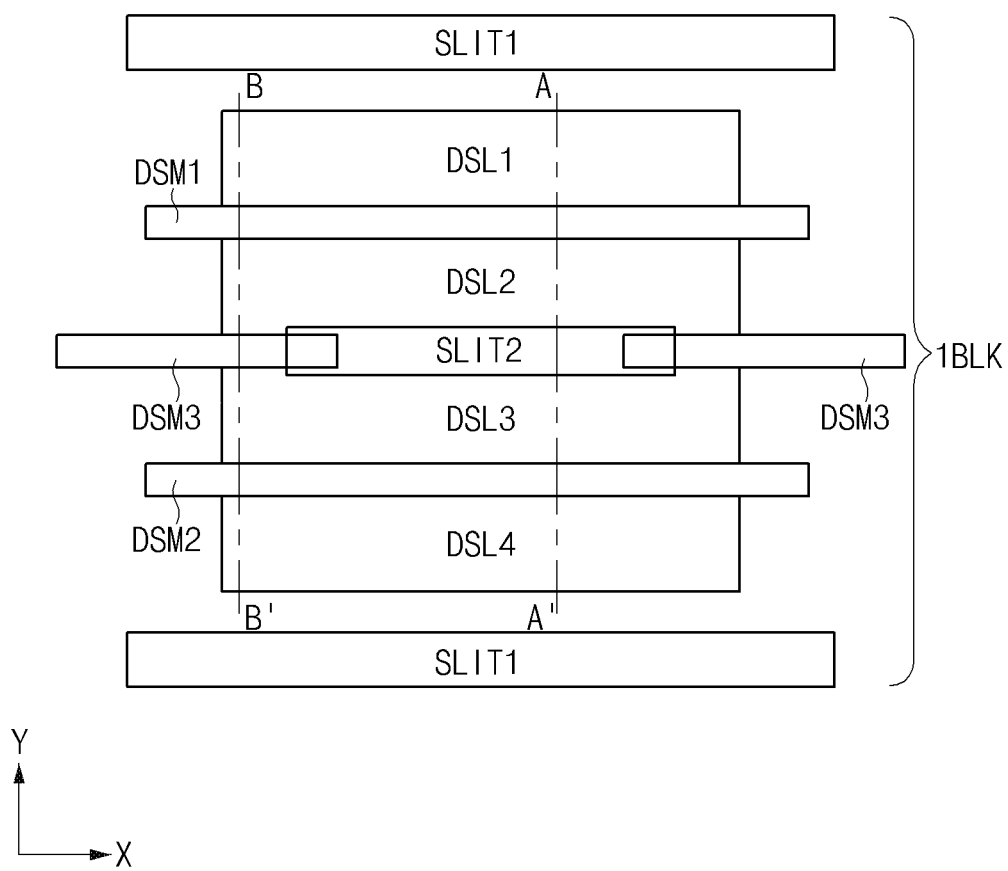
FIG. 3 is a schematic diagram illustrating a layout structure of a semiconductor device according to an embodiment of the disclosed technology.
Figure 4:
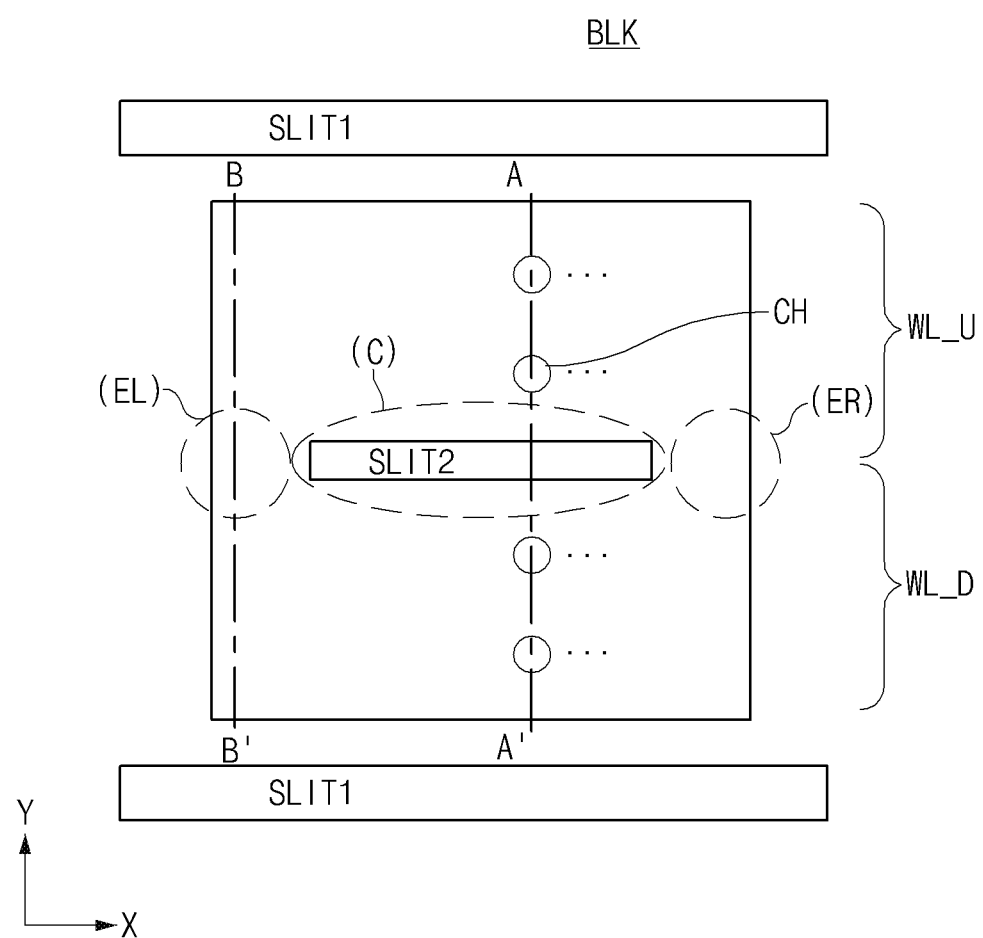
FIG. 4 is a plan view illustrating a word-line structure for use in a memory block of the semiconductor device shown in FIG. 3 according to an embodiment of the disclosed technology.

FIG. 3 is a schematic diagram illustrating a layout structure of a semiconductor device according to an embodiment of the disclosed technology. FIG. 4 is a plan view illustrating a word-line (WL) structure for use in a memory block BLK of the semiconductor device shown in FIG. 3, which is also a plan view. Compared to the structure shown in FIG. 3, the structure shown in FIG. 4 does not include upper drain selection lines DSL1~DSL4, and includes a plan view of the word lines (WL). For convenience of description and better understanding of the disclosed technology, interlayer insulation films (i.e., layers between word lines) are not illustrated in FIGS. 3 and 4.

Referring to FIGS. 3 and 4, a semiconductor device according to embodiments of the disclosed technology may include a plurality of first slits (SLIT1) (including a first outer slit and a second outer slit) formed over the substrate (not shown) and a second slit (SLIT2). FIG. 3 illustrates a plurality of isolation patterns DSM1, DSM2, and DSM3 and a plurality of drain selection lines DSL1~DSL4. FIG. 4 illustrates word lines WL_U and WL_D, and a vertical channel (CH). For convenience of description and better understanding of the disclosed technology, it is assumed that each of the semiconductor devices shown in FIGS. 3 and 4 includes only one memory block BLK from among a plurality of memory blocks.

In a three-dimensional (3D) memory device, slits configured to pass through the word lines (WL) may be formed to isolate stacked word lines (WL) from each other in units of a memory block BLK.

For example, a plurality of first slits (SLIT1) may be formed at both or opposite sides of a memory block BLK. The first slit (SLIT1) may be disposed at a boundary region between adjacent memory blocks (BLK), such that the first slits (SLIT1) may isolate the contiguous memory blocks (BLK) from each other. The first slits (SLIT1) may be formed to penetrate conductive films (not shown) so that the conductive films are isolated from each other in units of a memory block BLK. In an example, the conductive films may include word lines WL_U and WL_D.

The first slits (SLIT1) may be disposed at both, or opposite, sides of a structure that includes the word lines WL_U and WL_D. For example, first slits (SLIT1) may be spaced apart in the Y-axis direction to be on opposite sides of the structure that includes the word lines WL_U and WL_D. As illustrated in FIG. 3, a first slit (SLIT1) may be disposed at one side of a drain selection line DSL1 with respect to the Y-axis. Another first slit (SLIT1) may be disposed at the other side of a drain selection line DSL4 with respect to the Y-axis direction. In addition, each of the first slits (SLIT1) may be formed in a line shape extending in the X-axis direction.

An insulation film (not illustrated) may be formed between each of the first slits (SLIT1) and each of the word lines WL_U and WL_D. For example, the insulation film may include a nitride film or an oxide film. Each of the first slits (SLIT1) may operate as a support for supporting the word lines WL_U and WL_D. Each of the first slits (SLIT1) may include a metal material. For example, each of the first slits (SLIT1) may include tungsten (W).

The second slit (SLIT2) may be disposed at or near the center region (C) of the structure containing word lines WL_U and WL_D. For example, the second slit (SLIT2) may be disposed so that the second slit (SLIT2) penetrates the center region of the stacked word lines WL_U and WL_D. The second slit (SLIT2) may be formed in a line shape extending in the X-axis direction. The second slit (SLIT2) may be shorter in length in the X-direction than each of the first slits (SLIT1), and may overlap entirely with each of the first slits (SLIT1).

Each memory block BLK may include a plurality of drain selection lines DSL1~DSL4. The drain selection lines DSL1~DSL4 may be formed over the word lines WL_U and WL_D. The drain selection lines DSL1~DSL4 may be spaced apart from each other in the Y-axis direction by a predetermined distance or pitch.

The drain selection lines DSL1~DSL4 may be arranged symmetrical to one another across the second slit (SLIT2). For example, the drain selection line DSL1 and the drain selection line DSL2 may mirror the drain selection line DSL4 and the drain selection line DSL3, respectively, across a plane centered on second slit (SLIT2) and perpendicular to the a top surface of the substrate. The drain selection line DSL2 and the drain selection line DSL3 may be isolated from each other by an isolation pattern DSM3.

The isolation pattern DSM1 may be formed between the drain selection line DSL1 and the drain selection line DSL2. The isolation pattern DSM2 may be formed between the drain selection line DSL3 and the drain selection line DSL4. Each of the isolation patterns DSM1 and DSM2 may be formed in a line shape extending in the X-axis direction.

The isolation patterns DSM3, together with second slit (SLIT2), may isolate the drain selection line DSL2 and the drain selection line DSL3 from each other. Each of the isolation patterns DSM3 may be formed in a line shape extending in the X-axis direction. In an embodiment, each of the isolation patterns DSM3 may be shorter in length than the second slit (SLIT2). The isolation patterns DSM3 may be formed or located to traverse the edge regions EL and ER at either end of second slit (SLIT2). The isolation patterns DSM3 may be disposed at both ends of the second slit (SLIT2), and spaced apart in the X-axis direction. The isolation patterns DSM1, DSM2, and DSM3 may isolate the drain selection lines DSL1~DSL4 from one another in units within a memory block BLK.

Each memory block BLK may include vertical channels (CH) formed to penetrate the word lines WL_U and WL_D in a vertical direction, i.e. in a direction perpendicular to the X-Y plane. Vertical channels (CH) may be used to implement a plurality of cell strings. The cell strings of the memory block BLK may electrically interconnect the memory cells of the semiconductor device through the vertical channels (CH).

In cell array CAR, a memory block BLK may include a word line structure that includes word lines WL_U and WL_D disposed between the first slits (SLIT1). A second slit (SLIT2) may be formed in the center region (C) of the word line structure, extending in the X-direction. The second slit (SLIT2) may also extend in the vertical direction through the word line structure to the substrate SUB. Regions of the word line structure at the ends of the second slit (SLIT2) may be designated a left edge region (EL) and a right edge region (ER). The left edge region (EL) and the right edge region (ER), together with second slit (SLIT2), may divide the word line structure into word lines WL_U on one side of second slit (SLIT2), and word lines WL_D on the other side of second slit (SLIT2). Thus, word lines (WL_U) and word lines (WL_D) are spaced apart in the Y-axis direction with respect to the center region (C) and may be larger in thickness than the left edge region (EL) and the right edge region (ER) in the Y-axis direction with respect to the center region (C).

Put another way, a memory block BLK may be divided into one half block and another half block by the second slit (SLIT2) and the left edge region (EL) and the right edge region (ER). That is, upper word lines (WL_U) arranged in the Y-axis direction with respect to the center region (C) may correspond to one half block, and lower word lines (WL_D) may correspond to the other half block.

The upper half block corresponding to the upper word lines (WL_U) may include drain selection lines DSL1 and DSL2, which are isolated from each other by the isolation pattern DSM1. The lower half block corresponding to the lower word lines (WL_D) may include drain selection lines DSL3 and DSL4, which are isolated from each other by the isolation pattern (DSM2). Accordingly, in an example, one memory block BLK may be divided into a total of 4 quarter blocks respectively corresponding to the drain selection lines DSL1~DSL4. The drain selection lines DSL1~DSL4, and the four quarter blocks, may operate independently of each other.

In some implementations of the disclosed technology, the left edge region (EL) and the right edge region (ER) of the word line structure couple upper word lines WL_U and lower word lines WL_D together. In other words, although the center region (C) of the word lines (WL) is isolated by the second slit (SLIT2), in the edge regions EL and ER, the word lines may be merged together to avoid isolation. As described above, upper word lines WL_U and lower word lines WL_D may be merged with each other in both edge regions EL and ER, thereby reducing the resistance of the word lines (WL) compared to a word line structure in which word lines are merged in only one edge region.

For example, if a memory chip and a logic circuit chip are stacked in the 3D semiconductor memory device, the edge regions EL and ER of the word lines (WL) may be isolated from each other by the second slit (SLIT2). In this case, during a program operation time of the semiconductor memory device, channel capacitance of a non-selected cell string may be reduced so that RC loading (RC delay) can increase. Therefore, the edge regions EL and ER according to the present embodiment may be merged with each other such that the resultant edge regions may be implemented in a tied edge shape, resulting in reduction in resistance of word lines (WL).

Figure 5:
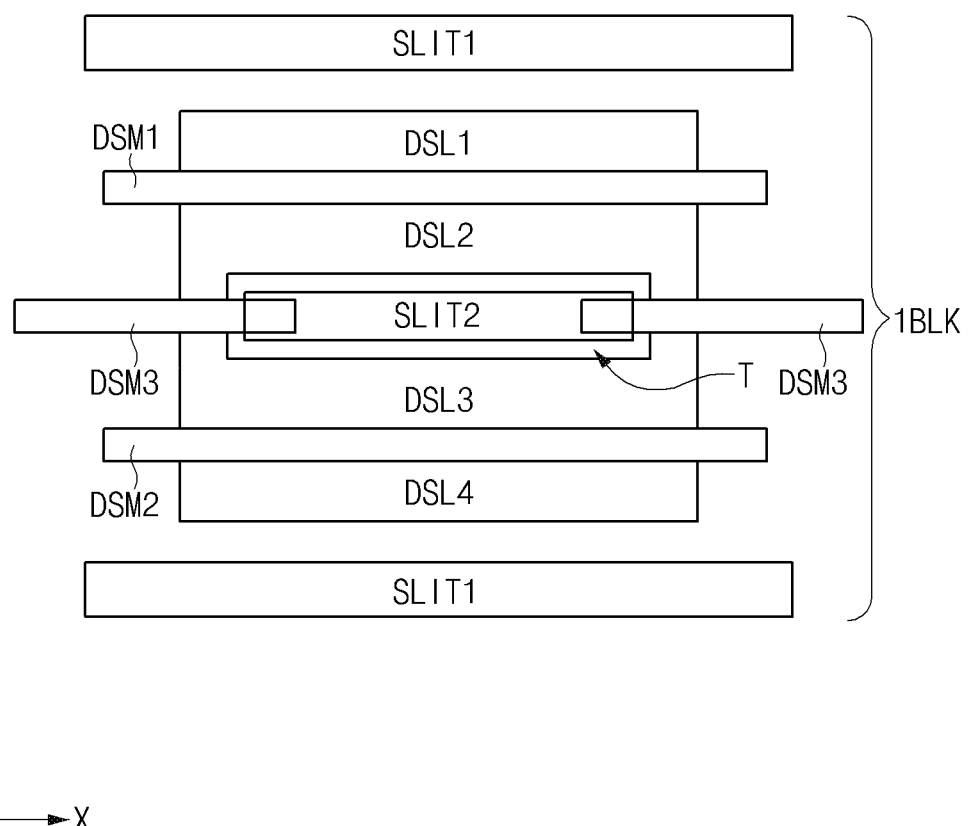
FIG. 5 is a schematic diagram illustrating a layout structure of a semiconductor device according to another embodiment of the disclosed technology.
Figure 6:
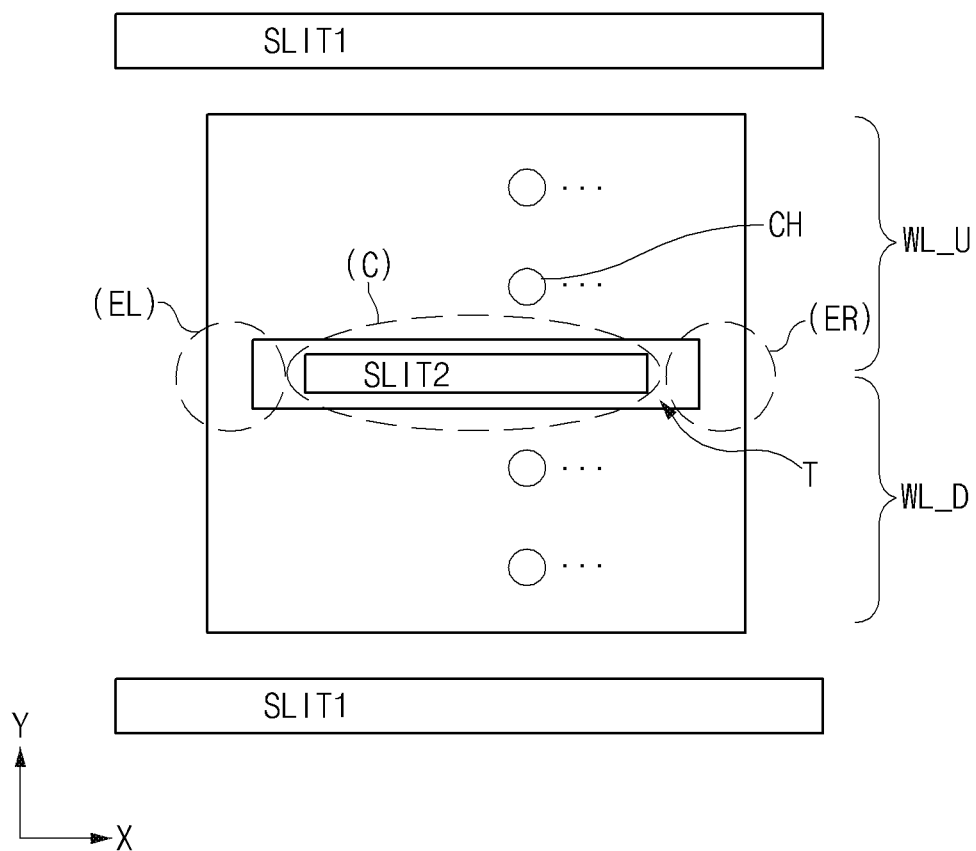
FIG. 6 is a plan view illustrating a word-line structure for use in a memory block of the semiconductor device shown in FIG. 5 according to another embodiment of the disclosed technology.

FIG. 5 is a schematic diagram illustrating a layout structure of a semiconductor device according to another embodiment of the disclosed technology. FIG. 6 is a plan view illustrating a word-line structure for use in a memory block BLK of the semiconductor device shown in FIG. 5. In FIGS. 5 and 6, the same constituent elements as those of FIGS. 3 and 4 described above will be used to refer to the same or like parts for convenience of description and better understanding of the disclosed technology, and as such redundant matters thereof will herein be omitted for brevity.

Referring to FIGS. 5 and 6, the second slit (SLIT2) may be disposed at the center region (C) of the word lines (WL). The second slit (SLIT2) may be disposed over a through-region (T) for isolating the upper word lines WL_U and lower word lines WL_D from each other.

The drain selection lines DSL1~DSL4 may be formed symmetrical to each other across the second slit (SLIT2). For example, the drain selection line DSL2 and the drain selection line DSL3 may be formed in a "¬"-shaped structure that mirror or face each other with respect to the through-region (T). The drain selection line DSL2 and the drain selection line DSL3 may be isolated from each other by the isolation pattern DSM3.

The isolation pattern DSM3 may isolate the drain selection line DSL2 and the drain selection DSL3 from each other. In an example, the isolation pattern DSM3 may be coupled to the through-region (T) in an area overlapping the ends of second slit (SLIT2). The isolation patterns DSM3 may be coupled to both ends of the second slit (SLIT2).

The upper word lines WL_U and lower word lines WL_D may be formed in a square band shape in which the through-region (T) is formed at or near the center region (C). The second slit (SLIT2) may be formed in the through-region (T). One upper word line WL_U and one lower word line WL_D, with respect to the through-region (T), may be larger in thickness than the left edge region EL and the right edge region ER with respect to the through-region (T). In the through-region (T), an insulation film may be formed between the second slit (SLIT2) and each of the word lines WL_U and WL_D. The insulation film may include a nitride film or an oxide film, as an example.

Figure 7A:
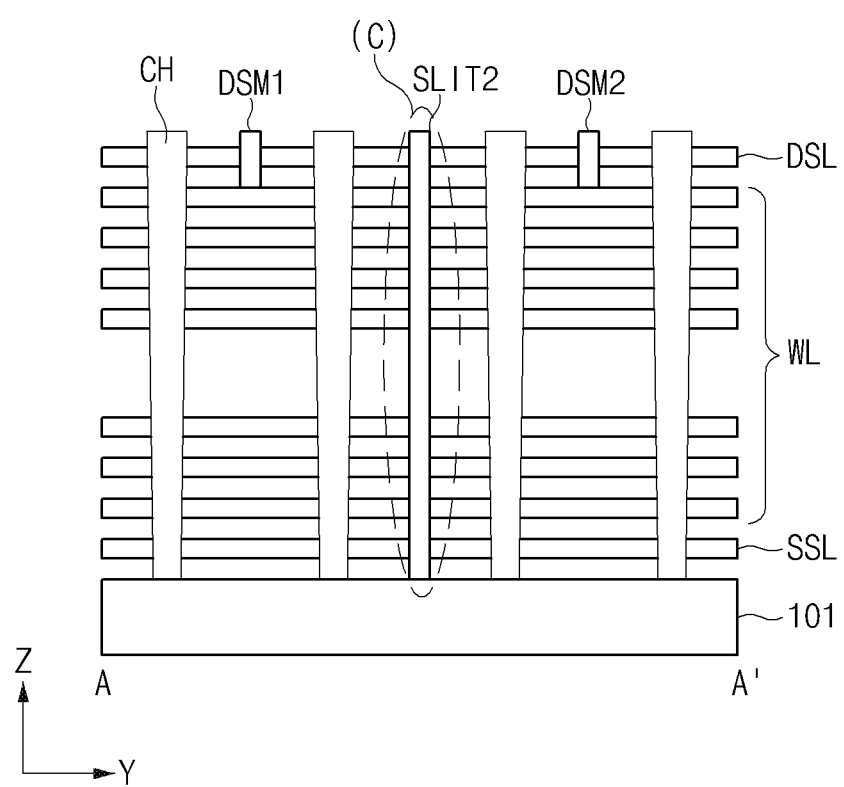
FIGS. 7A and 7B are cross-sectional views illustrating the semiconductor device shown in FIGS. 3 and 4.
Figure 7B:
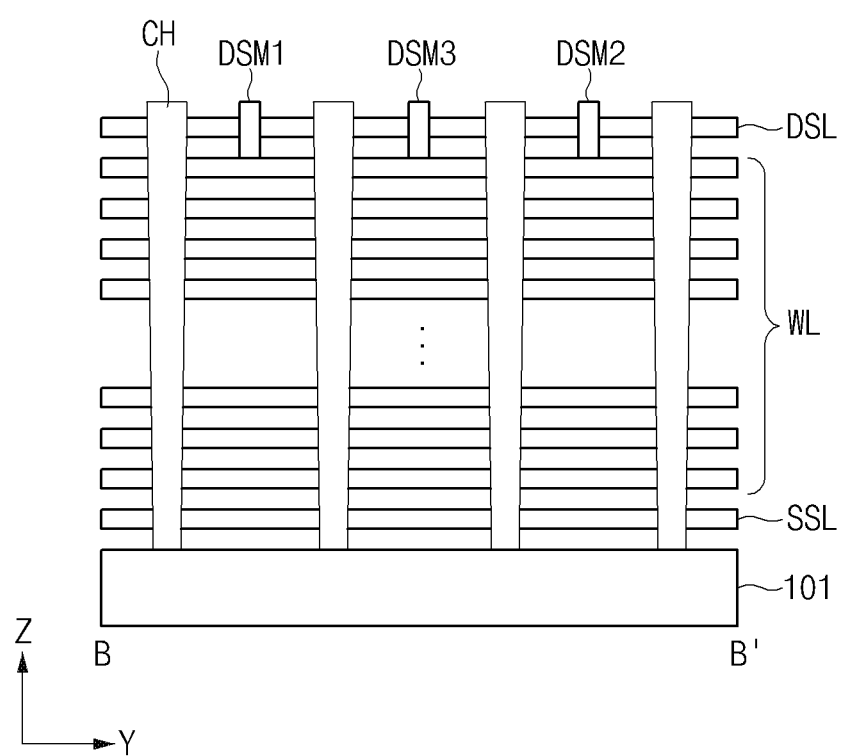

FIGS. 7A and 7B are cross-sectional views illustrating the semiconductor device shown in FIGS. 3 and 4.

FIG. 7A is a cross-sectional view illustrating the semiconductor device taken along the line A-A' shown in FIGS. 3 and 4. FIG. 7B is a cross-sectional view illustrating the semiconductor device taken along the line B-B' shown in FIGS. 3 and 4. For convenience of description, it should be noted that FIGS. 7A and 7B illustrate only some principal essential elements as compared to the constituent elements shown in FIGS. 3 and 4. For convenience of description and better understanding of the disclosed technology, interlayer insulation films are not illustrated in FIGS. 7A and 7B.

Referring to FIG. 7A, the semiconductor device may include a source selection line SSL, a plurality of word lines (WL), and a drain selection line (DSL), which are vertically stacked over a substrate 101. The source selection line SSL, the plurality of word lines (WL), and the drain selection line DSL may be spaced apart from one another by a predetermined distance or pitch in the extension direction of the vertical channel (CH), and may be stacked over the substrate 101.

The vertical channel (CH) may be formed to penetrate through the source selection line SSL, the plurality of word lines (WL), and the drain selection line DSL to the substrate 101. One end of the vertical channel (CH) may be coupled to a corresponding bit line (not shown) through a bit-line contact plug (not shown).

The plurality of word lines (WL) may be stacked in the form of a multilayer structure that surrounds the vertical channels (CH). The drain selection line DSL may be disposed over the plurality of word lines (WL). The source selection line SSL may be disposed below the plurality of word lines (WL).

In an example, the drain selection line DSL may be coupled to the gates of corresponding drain selection transistors (not shown). The word lines (WL) may be respectively coupled to gates of memory cells (not shown) corresponding thereto. The source selection line SSL may be coupled to gates of source selection transistors (not shown).

As can be seen from FIG. 7A, in the center region (C) of the memory block BLK, a drain selection line DSL may be divided into a predetermined number of sections corresponding to the number of unit blocks (e.g., quarter blocks). For example, the drain selection line DSL may be divided into four sections by the isolation pattern DSM1, the second slit (SLIT2), and the isolation pattern DSM2.

In FIG. 7A, the memory block BLK is divided by the second slit (SLIT2), and similarly the source selection line SSL is also divided by the second slit (SLIT2).

In FIG. 7B, in left edge region EL of the memory block BLK, the drain selection line DSL may be divided into a predetermined number of sections corresponding to the number of unit blocks (e.g., quarter blocks). That is, the drain selection line DSL may be divided into four sections by the isolation pattern DSM1, the isolation pattern DSM3, and the isolation pattern DSM2.

In contrast to FIG. 7A, however, in FIG. 7B at the left edge region EL of the word line structure, the word lines (WL) are not isolated from each other in the single memory block BLK by the second slit (SLIT2). Likewise, the source selection line SSL is also not divided into isolated segments in the memory block BLK by the second slit (SLIT2). Because the source selection line SSL is not isolated, the number of mask processes needed to isolate the source selection line SSL can be reduced.

As described above, the second slit (SLIT2) is not extended through the edge regions EL and ER, and the word lines WL_U and WL_D may be coupled to each other in the edge regions EL and ER. However, in some embodiments, the isolation pattern DSM3 is coupled to the second slit (SLIT2) in the edge regions EL and ER, so that the drain selection line DSL can be isolated.

FIGS. 8A to 8D are cross-sectional views illustrating fabrication processes for forming the structure shown in FIG. 7A. FIGS. 9A to 9D are cross-sectional views illustrating fabrication processes for forming the structure shown in FIG. 7B. For convenience of description, the interlayer insulation films are omitted in FIGS. 8A to 9D.

Figure 8A:
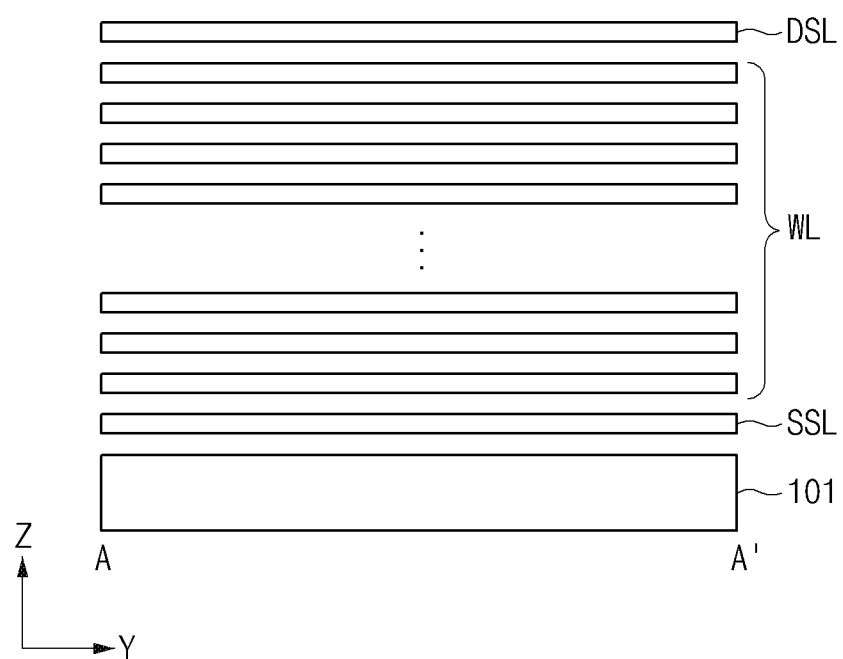
FIGS. 8A to 8D are cross-sectional views illustrating fabrication processes for forming the structure shown in FIG. 7A.
Figure 9A:
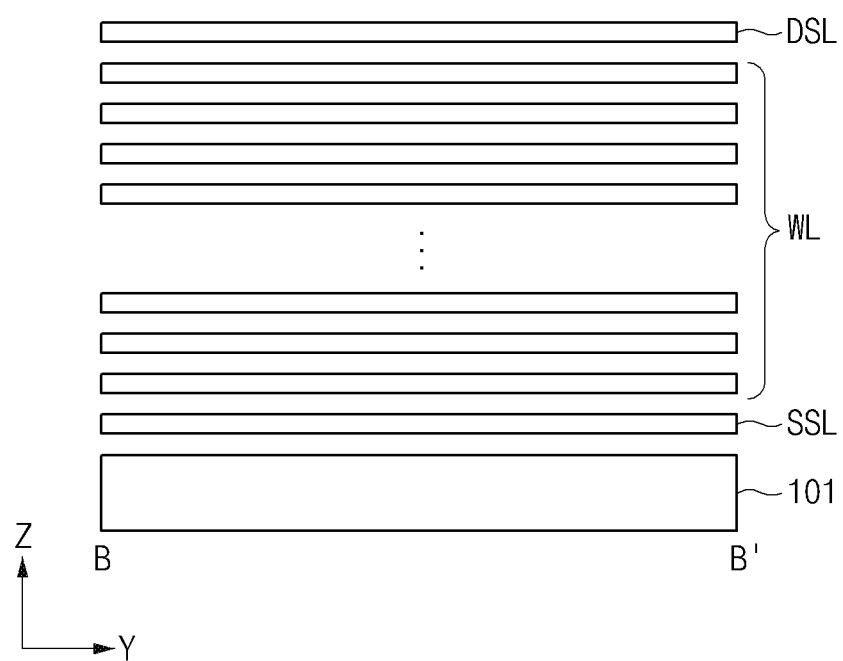
FIGS. 9A to 9D are cross-sectional views illustrating fabrication processes for forming the structure shown in FIG. 7B.

Referring to FIGS. 8A and 9A, a source selection line SSL, a plurality of word lines (WL), and a drain selection line DSL may be sequentially stacked over the substrate 101.

Figure 8B:
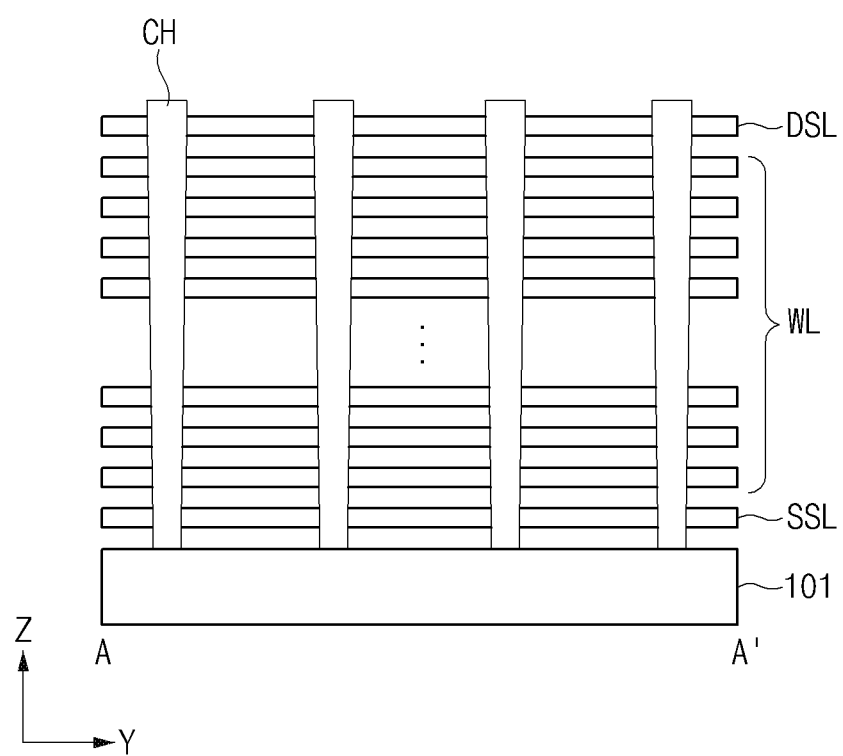
Figure 9B:
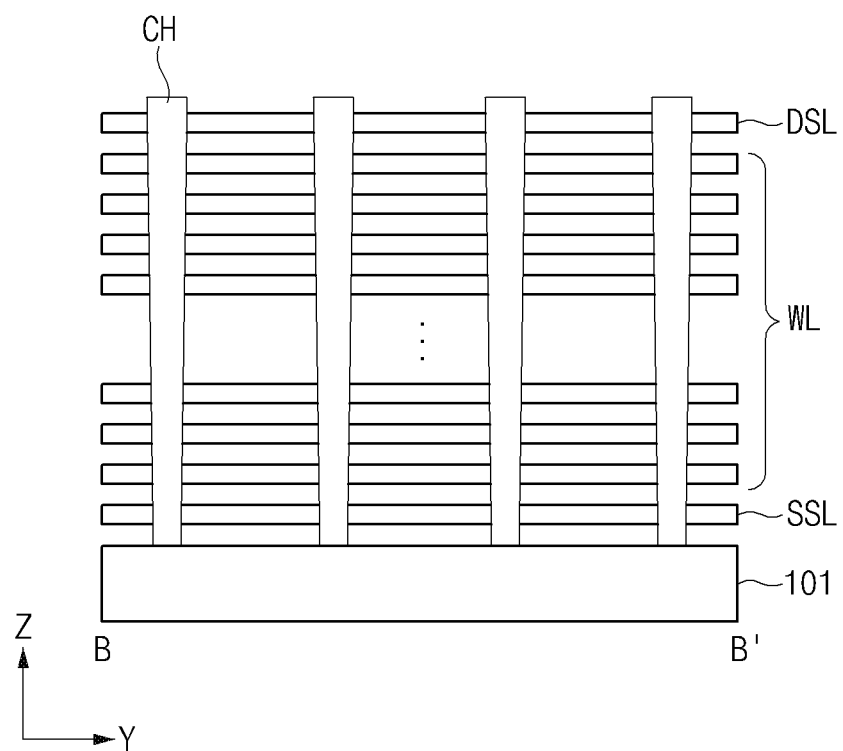

Referring to FIGS. 8B and 9B, the drain selection line DSL, the plurality of word lines (WL), and the source selection line SSL may be etched to a predetermined depth to expose substrate 101, resulting in the formation of channel holes (not shown). The channel holes (not shown) may be filled with channel structures to form vertical channels (CH) that extend through the drain selection line DSL, the plurality of word lines (WL), and the source selection line SSL.

Figure 8C:
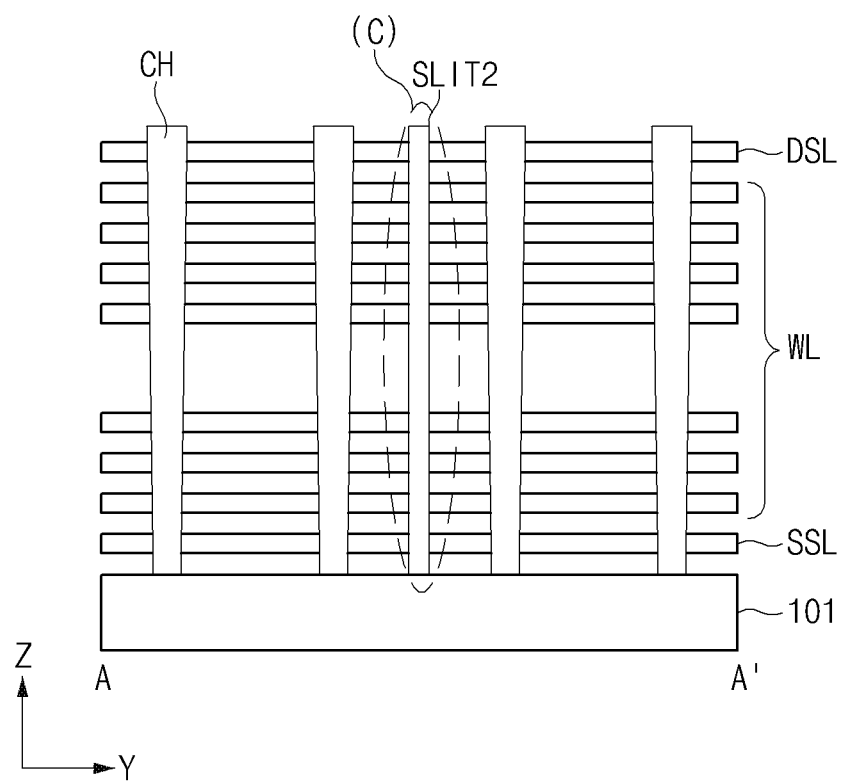

Thereafter, as can be seen from FIG. 8C, the center region (C) of the drain selection line DSL, the plurality of word lines (WL), and the source selection line SSL is etched to form a trench (not shown). The trench (not shown) may be filled with an insulation film, resulting in formation of the second slit (SLIT2) that isolates portions of the drain selection line DSL, the plurality of word lines (WL), and the source selection line SSL from each other, respectively.

Figure 9C:
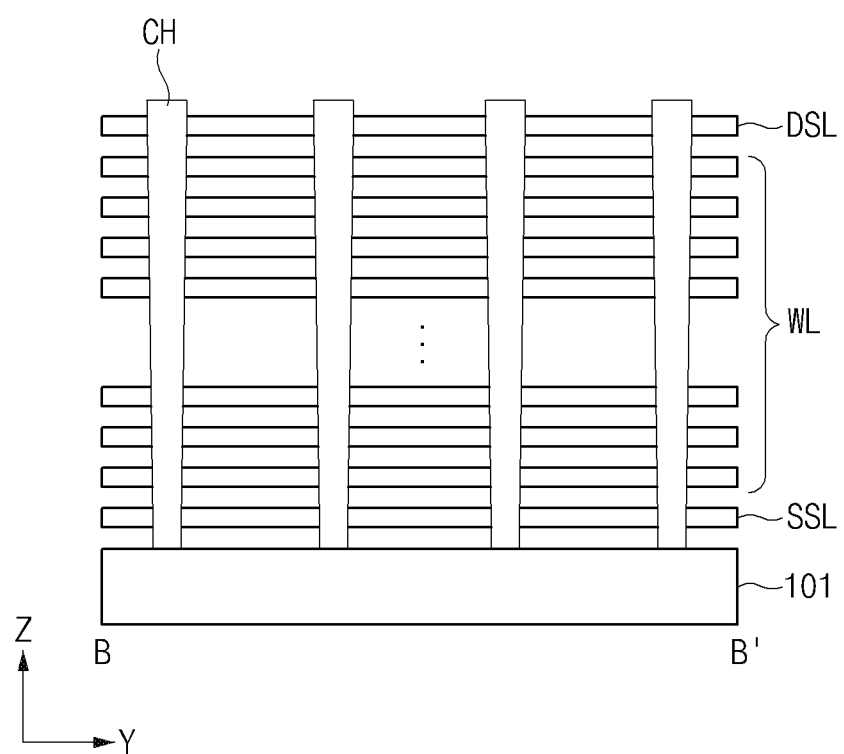

In contrast, in FIG. 9C, the second slit (SLIT2) is not formed in the edge regions EL and ER of the word lines (WL). During the etch process of forming the trench (not shown) shown in FIG. 8C, the center region (C) of the drain selection lines DSL, the plurality of word lines (WL), and the source selection line SSL is etched. However, in the edge regions EL and ER, the drain selection lines DSL, the plurality of word lines (WL), and the source selection line SSL may not be etched as shown in FIG. 9C.

Figure 8D:
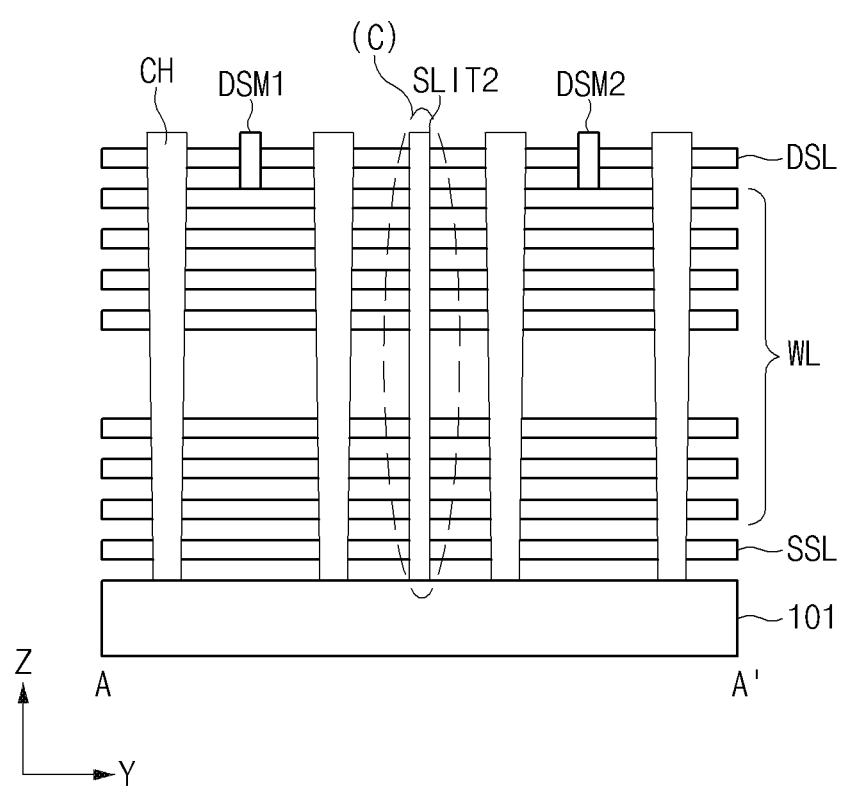

Subsequently, as can be seen from FIG. 8D, in the center region (C), the isolation pattern DSM1 and the isolation pattern DSM2 may be formed so that segments of the drain selection line DSL are isolated from each other. In this case, when the drain selection lines DSL are isolated from each other, a drain selection line (DSL) separation mask (DSM) process may be used.

That is, a mask film (not shown) is formed over a stacked structure, and the mask film is then patterned by a photolithography process. Subsequently, the stacked structure may be etched by an etch process in which the mask film is used as an etch barrier, resulting in formation of the isolation patterns DSM1 and DSM2. As a result, the drain selection line DSL can be isolated from each other.

Figure 9D:
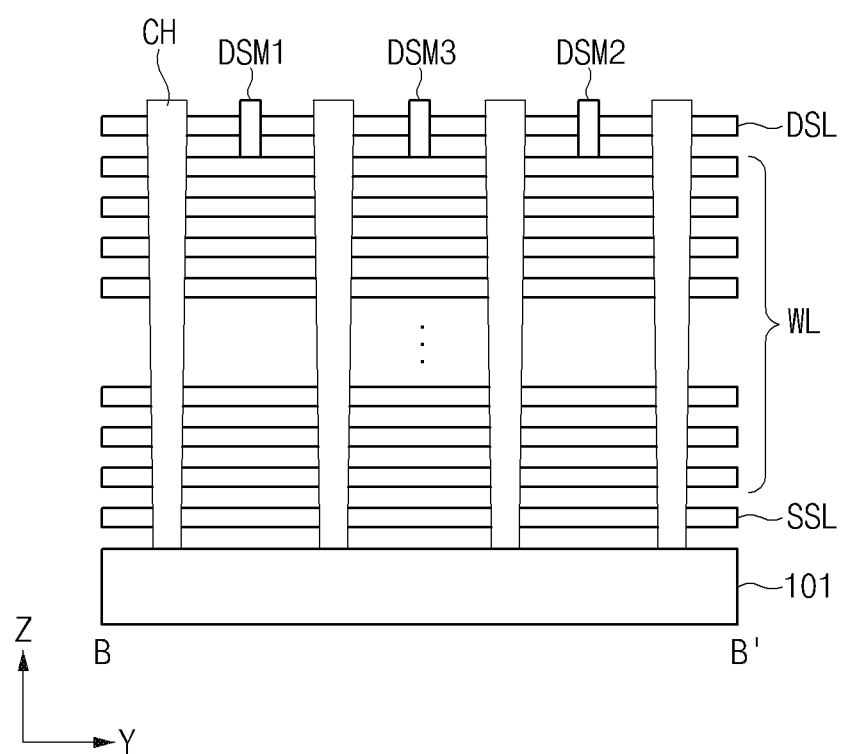

Referring to FIG. 9D, in the edge regions EL and ER, the isolation pattern DSM1, the isolation pattern DSM3, and the isolation pattern DSM2 may be formed so that segments of the drain selection line DSL are isolated from each other. However, in the edge regions EL and ER, the plurality of word lines (WL) and the source selection line SSL are not etched.

Figure 10:
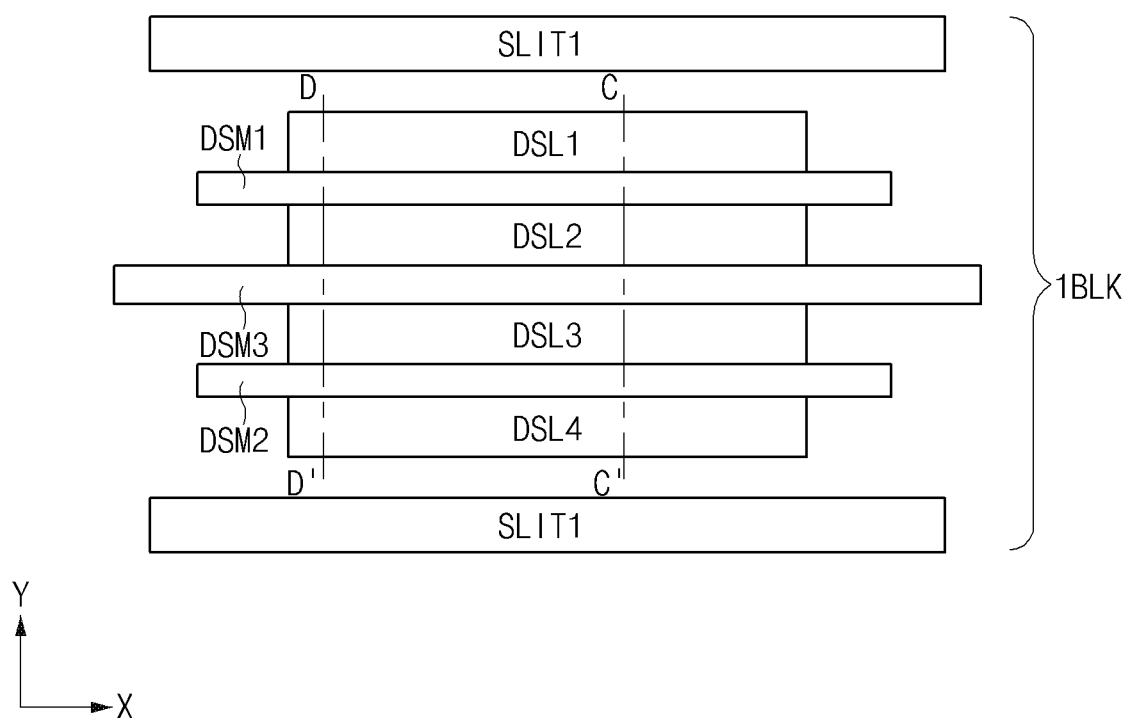
FIG. 10 is a schematic diagram illustrating a layout structure of a semiconductor device according to still another embodiment of the disclosed technology.
Figure 11:
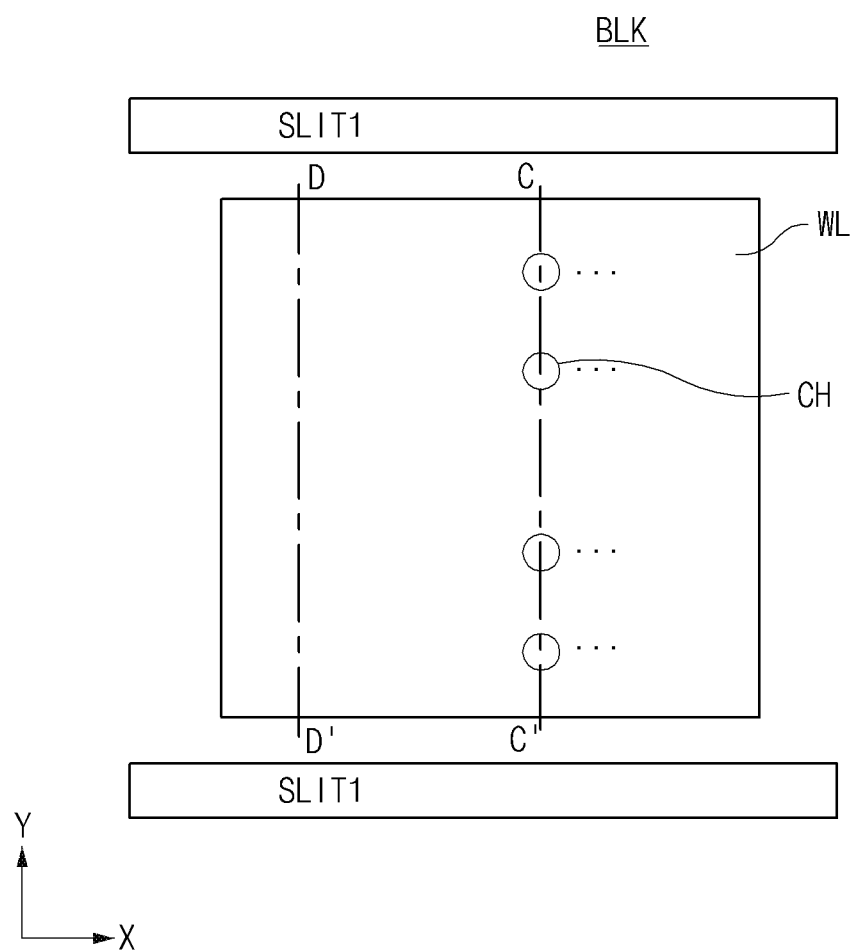
FIG. 11 is a plan view illustrating a word-line structure for use in the semiconductor device shown in FIG. 10 according to yet another embodiment of the disclosed technology.

FIG. 10 is a schematic diagram illustrating a layout structure of a semiconductor device according to yet another embodiment of the disclosed technology. FIG. 11 is a plan view illustrating a word-line (WL) structure contained in the memory block BLK of the semiconductor device shown in FIG. 10. In FIGS. 10 and 11, the same constituent elements as in the embodiments of FIGS. 3 and 4 will herein be omitted for convenience of description, and the embodiments of FIGS. 10 and 11 will hereinafter be described centering on differences from structures illustrated in FIGS. 3 and 4. For easier recognition and better understanding of the disclosed technology, the interlayer insulation films are not illustrated in FIGS. 10 and 11.

Referring to FIGS. 10 and 11, a semiconductor device according to yet another embodiment of the disclosed technology may include a plurality of first slits (SLIT1) formed over a substrate (not shown), a plurality of isolation patterns DSM1, DSM2, and DSM3, a plurality of drain selection lines DSL1~DSL4, word lines (WL), and a plurality of vertical channels (CH).

The embodiments of FIGS. 10 and 11 illustrate a word line structure in which word lines (WL) are merged into one structure so that a plate structure can be implemented. As an example, in a plan view, the word lines (WL) may have a rectilinear shape.

The word lines (WL) shown in FIGS. 10 and 11 may not include the second slit (SLIT2), as compared to the embodiments of FIGS. 3 and 4. The isolation pattern DSM3 may be formed to extend in the X-axis direction, as compared to the embodiments of FIGS. 3 and 4. The isolation pattern DSM3 may be formed to extend in the X-axis direction, similar to the isolation patterns DSM1 and DSM2. The isolation pattern DSM3 may be formed to extend in the X-axis direction so as to traverse the word lines (WL).

The memory block BLK may include a plurality of drain selection lines DSL1~DSL4. The drain selection lines DSL1~DSL4 may be formed over the word lines (WL). The drain selection lines DSL1~DSL4 may be spaced apart from each other by a predetermined distance or pitch in the Y-axis direction. Each of the drain selection lines DSL1~DSL4 may be formed in a line shape extending in the X-axis direction.

Figure 12:
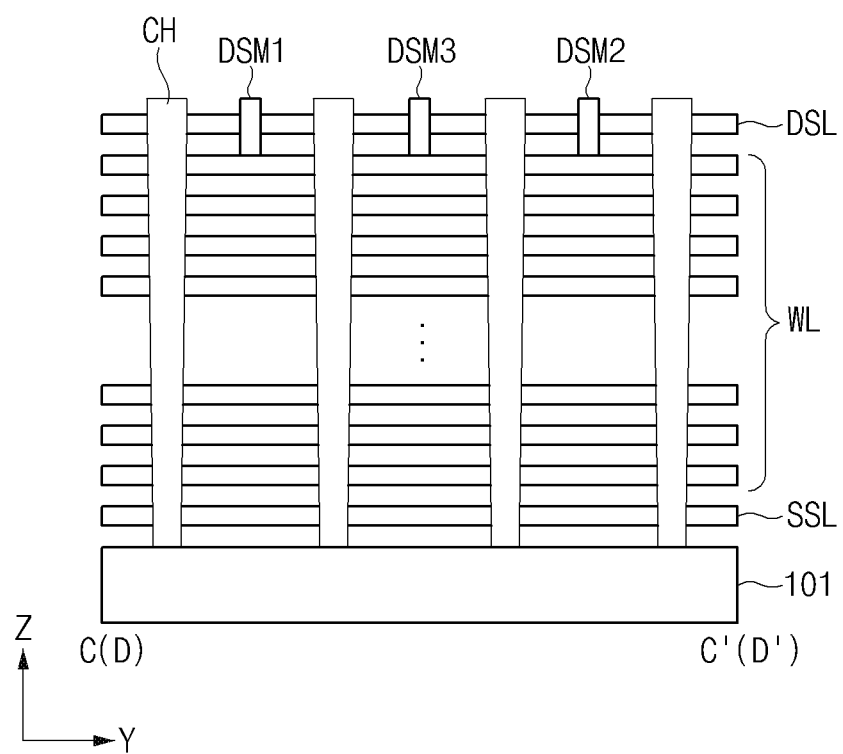
FIG. 12 is a cross-sectional view illustrating the semiconductor device shown in FIG. 10 according to yet another embodiment of the disclosed technology.

FIG. 12 is a cross-sectional view illustrating the semiconductor device shown in FIG. 10. For convenience of description and better understanding of the disclosed technology, the interlayer insulation films are not illustrated in FIG. 12.

Referring to FIG. 12, the word lines (WL) may be integrated into a single structure without being isolated from each other. Therefore, the cross-sectional view of the semiconductor device taken along the line C-C' shown in FIG. 10 may be identical to the cross-sectional view of the semiconductor device taken along the line D-D' shown in FIG. 10.

Referring to FIG. 12, the semiconductor device may include a source selection line SSL, a plurality of word lines (WL), and a drain selection line DSL that are vertically stacked over a substrate 101. In other words, the source selection line SSL, the plurality of word lines (WL), and the drain selection line DSL may be spaced apart from one another by a predetermined distance in the extension direction of vertical channels (CH), and may then be stacked over the substrate 101.

The vertical channels (CH) may be formed to penetrate through the source selection line SSL, the plurality of word lines (WL), and the drain selection line DSL in a direction perpendicular to the surface of substrate 101. One end of the vertical channel (CH) may be coupled to a corresponding bit line (not shown) through a bit-line contact plug (not shown).

The plurality of word lines (WL) may be stacked in the form of a multilayer structure (together with interlayer insulation films not illustrated) that surrounds the vertical channels (CH). The drain selection line DSL may be disposed over the plurality of word lines (WL). The source selection line SSL may be disposed below the plurality of word lines (WL).

As can be seen from FIG. 12, in the entire region (i.e., the center region and the edge region) of the memory block BLK, the drain selection line DSL may be divided into a predetermined number of sections that correspond to the number of unit blocks (e.g., quarter blocks). For example, the drain selection line DSL may be divided into four sections by the isolation pattern DSM1, the isolation pattern DSM3, and the isolation pattern DSM2.

Thus, the word lines (WL) may be formed in an integrated structure without formation of isolated regions, such that the word lines (WL) are not isolated from each other in the single memory block BLK. Likewise, the source selection line SSL is not also isolated in the single memory block BLK.

Figure 13A:
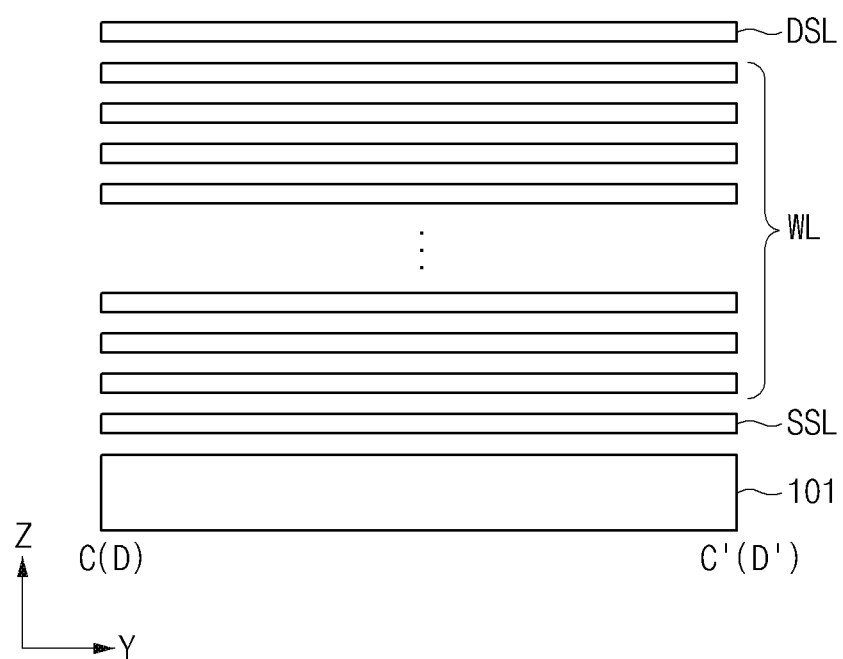
FIGS. 13A to 13C are cross-sectional views illustrating the structure shown in FIG. 12 according to a further embodiment of the disclosed technology.
Figure 13B:
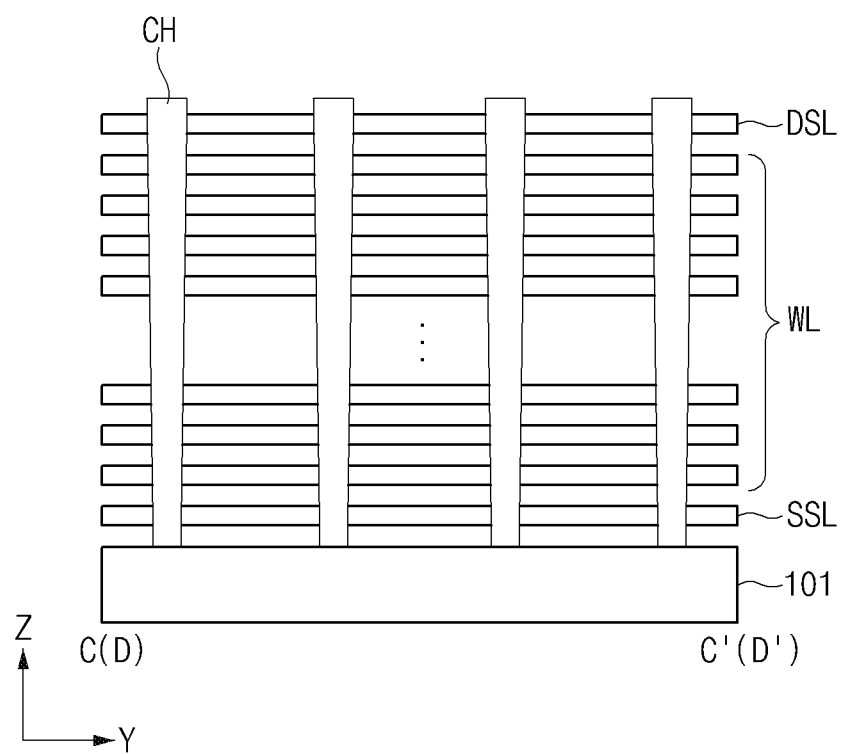
Figure 13C:
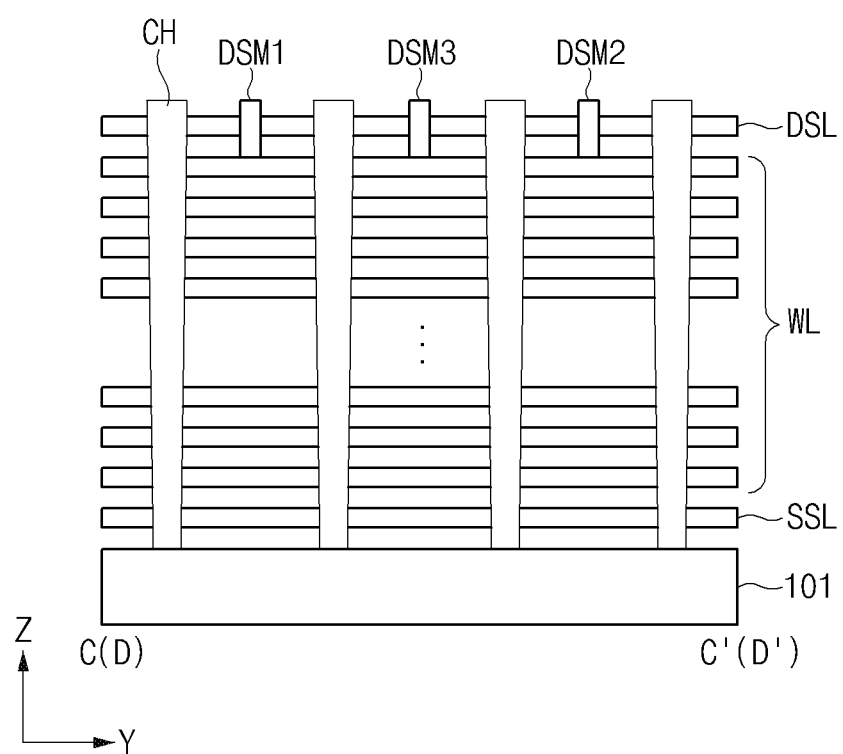

FIGS. 13A to 13C are schematic views illustrating fabrication processes of the semiconductor device shown in FIG. 12 according to a further embodiment of the disclosed technology. For convenience of description and better understanding of the disclosed technology, the interlayer insulation films are not illustrated in FIGS. 13A to 13C.

As can be seen from FIG. 13A, the source selection line SSL, the plurality of word lines (WL), and the drain selection lines DSL may be sequentially stacked over the substrate 101. As can be seen from FIG. 13B, the drain selection lines DSL, the plurality of word lines (WL), and the source selection line SSL may be etched to a predetermined depth to expose substrate 101, resulting in the formation of channel holes (not shown). The channel holes (not shown) may be filled with channel structures to form vertical channels (CH) that extend through the drain selection line DSL, the plurality of word lines (WL), and the source selection line SSL.

Subsequently, as can be seen from FIG. 13C, the drain selection line (DSL) can be etched and the isolation pattern DSM1, the isolation pattern DSM3, and the isolation pattern DSM2 may be formed so that segments of the drain selection line (DSL) can be isolated from each other. In this case, when the segments of the drain selection line DSL are isolated from each other, a DSL (Drain Selection Line) separation mask (DSM) process can be used as necessary.

In accordance with embodiments of the disclosed technology, the plurality of word lines (WL) and the source selection line SSL are not isolated from each other, such that the number of mask processes needed to isolate the source selection line SSL and the plurality of word line (WL) from each other can be reduced.

As is apparent from the above description, semiconductor devices based on embodiments of the disclosed technology can improve performance or throughput thereof by reducing resistance of word lines.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a first slit disposed at a boundary between contiguous memory blocks to isolate the memory blocks from each other, and including a first outer slit and a second outer slit, the second outer slit spaced apart in a first direction from the first outer slit by a predetermined distance;
    a word line disposed, between the first and second outer slits, including a center region having a first end and a second end, and an edge region located at the first end and the second end of the center region;
    a second slit disposed at the center region that isolates areas of the word line in the center region on either side of the second slit;
    a plurality of drain selection lines disposed between the first and second outer slits, and disposed to be spaced apart from each other by a predetermined distance with respect to the first direction; and
    a first isolation pattern that isolates each of a first drain selection line and a second drain selection line from among the plurality of drain selection lines,
    wherein the word line is continuous in the edge regions.

2. The semiconductor device according to claim 1, wherein the first and second outer slits are disposed at opposite sides of the word line with respect to the first direction, and extend in a second direction.

3. The semiconductor device according to claim 1, wherein the second slit is shorter in a second direction length than each of the first and second outer slits.

4. The semiconductor device according to claim 1, wherein each of the plurality of drain selection lines extends in a second direction.

5. The semiconductor device according to claim 1, wherein the first isolation pattern extends in a second direction.

6. The semiconductor device according to claim 1, wherein the first isolation pattern is disposed over an upper word line disposed on a side of the center region in the first direction.

7. The semiconductor device according to claim 1, further comprising:
    a second isolation pattern isolating each of a third drain selection line and a fourth drain selection line from among the plurality of drain selection lines.

8. The semiconductor device according to claim 7, wherein the second isolation pattern extends in a second direction.

9. The semiconductor device according to claim 7, wherein the second isolation pattern is disposed over a lower word line disposed on the other side of the center region in the first direction.

10. The semiconductor device according to claim 1, further comprising:
    a third isolation pattern that isolates each of a second drain selection line and a third drain selection line from among the plurality of drain selection lines,
    wherein the third isolation pattern is disposed to traverse the edge regions.

11. The semiconductor device according to claim 10, wherein the third isolation pattern extends in a second direction.

12. The semiconductor device according to claim 1, wherein the word line is defined, in a direction perpendicular to an upper surface of the substrate, as a rectilinear layer with the second slit in the center region.

13. The semiconductor device according to claim 1, wherein the greatest dimension among the center region, a left edge region, or a right edge region in the first direction is less than the distance between the edge of the region to the edge of the word line in the first direction.

14. A semiconductor device comprising:
   a source selection line disposed over a substrate;
   a plurality of word lines vertically stacked over the source selection line;
   a drain selection line stacked over the plurality of word lines;
   a slit defined in a center region of the plurality of word lines that vertically penetrates the source selection line, the plurality of word lines, and the drain selection line, and that isolates the source selection line, the plurality of word lines, and the drain selection line from one another in the center region; and
   a plurality of isolation patterns spaced apart from each other by a predetermined distance in edge regions of the plurality of word lines, and isolating the drain selection line into a plurality of isolated segments,
   wherein each of the plurality of isolation patterns extends in a same direction as the slit and penetrates the drain selection line.

15. The semiconductor device according to claim 14, further comprising:
   a vertical channel vertically penetrating the source selection line, the plurality of word lines, and the drain selection line.

16. The semiconductor device according to claim 14, wherein the plurality of isolation patterns comprising:
   a first isolation pattern formed at one side of the slit to isolate the drain selection line into a first drain selection line and a second drain selection line; and
   a second isolation pattern formed on the other side of the slit to isolate the drain selection line into a third drain selection line and a fourth drain selection line.

\* \* \* \* \*